United States Patent
Weis et al.

(10) Patent No.: US 12,471,384 B2
(45) Date of Patent: Nov. 11, 2025

(54) PROTECTION DEVICE WITH SPACE SAVING LAYOUT

(71) Applicant: Infineon Technologies Austria AG, Villach (AT)

(72) Inventors: Rolf Weis, Dresden (DE); Josef Deichler, Dresden (DE); Henning Feick, Dresden (DE); Ahmed Mahmoud, Freising (DE)

(73) Assignee: Infineon Technologies Austria AG, Villach (AT)

( * ) Notice: Subject to any disclaimer, the term of this patent is extended or adjusted under 35 U.S.C. 154(b) by 396 days.

(21) Appl. No.: 17/987,225

(22) Filed: Nov. 15, 2022

(65) Prior Publication Data

US 2023/0071856 A1     Mar. 9, 2023

Related U.S. Application Data

(63) Continuation-in-part of application No. 17/882,915, filed on Aug. 8, 2022.

(30) Foreign Application Priority Data

Aug. 16, 2021  (EP) .................... 21191573
Aug. 1, 2022   (EP) .................... 22188085

(51) Int. Cl.
| | | |
|---|---|---|
| H10D 89/60 | (2025.01) | |
| H10D 8/00  | (2025.01) | |
| H10D 8/01  | (2025.01) | |
| H10D 62/10 | (2025.01) | |
| H10D 62/83 | (2025.01) | |

(52) U.S. Cl.
CPC .................. H10D 89/611 (2025.01)

(58) Field of Classification Search
CPC ........ H10D 89/611; H10D 8/00; H10D 8/045; H10D 62/83; H10D 84/148; H10D 8/022; H10D 8/25; H10D 8/50; H10D 89/931; H10D 62/126
See application file for complete search history.

(56) References Cited

U.S. PATENT DOCUMENTS

| | | |
|---|---|---|
| 7,838,939 B2    | 11/2010 | Russ et al. |
| 2005/0077577 A1 | 4/2005  | Manna et al. |
| 2013/0200488 A1 | 8/2013  | Chung |
| 2016/0351557 A1 | 12/2016 | Weyers |
| 2018/0061823 A1 | 3/2018  | Weyers |
| 2020/0303262 A1 | 9/2020  | Katakura |
| 2021/0066510 A1* | 3/2021 | La Rosa ............ H10D 30/0411 |

FOREIGN PATENT DOCUMENTS

EP     0680089 A1   11/1995

* cited by examiner

*Primary Examiner* — Sonya McCall-Shepard
(74) *Attorney, Agent, or Firm* — Murphy, Bilak & Homiller, PLLC

(57) ABSTRACT

A method for producing a protection device and a protection device are disclosed. The method includes: forming a first diode arrangement including at least one first diode and at least one second diode connected in anti-series between a first circuit node and a second circuit node of the first diode arrangement; forming a second diode arrangement including at least one first diode and at least one second diode connected in anti-series between a first circuit node and a second circuit node of the second diode arrangement; and connecting the second circuit node of the first diode arrangement and the second circuit node of the second diode arrangement.

9 Claims, 8 Drawing Sheets

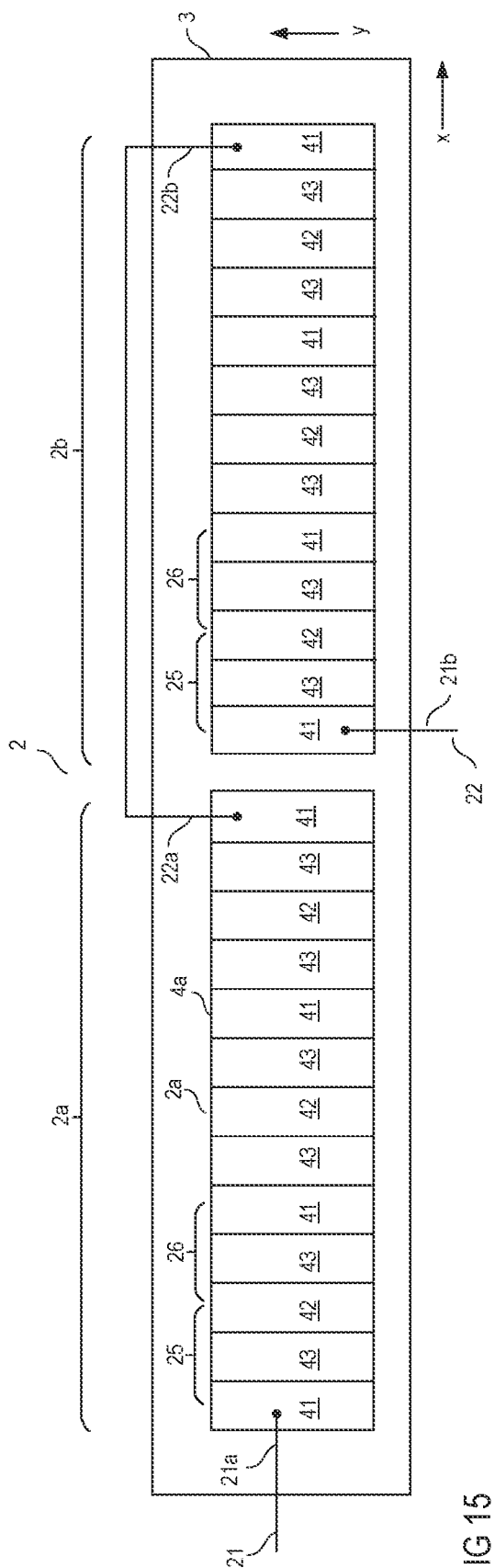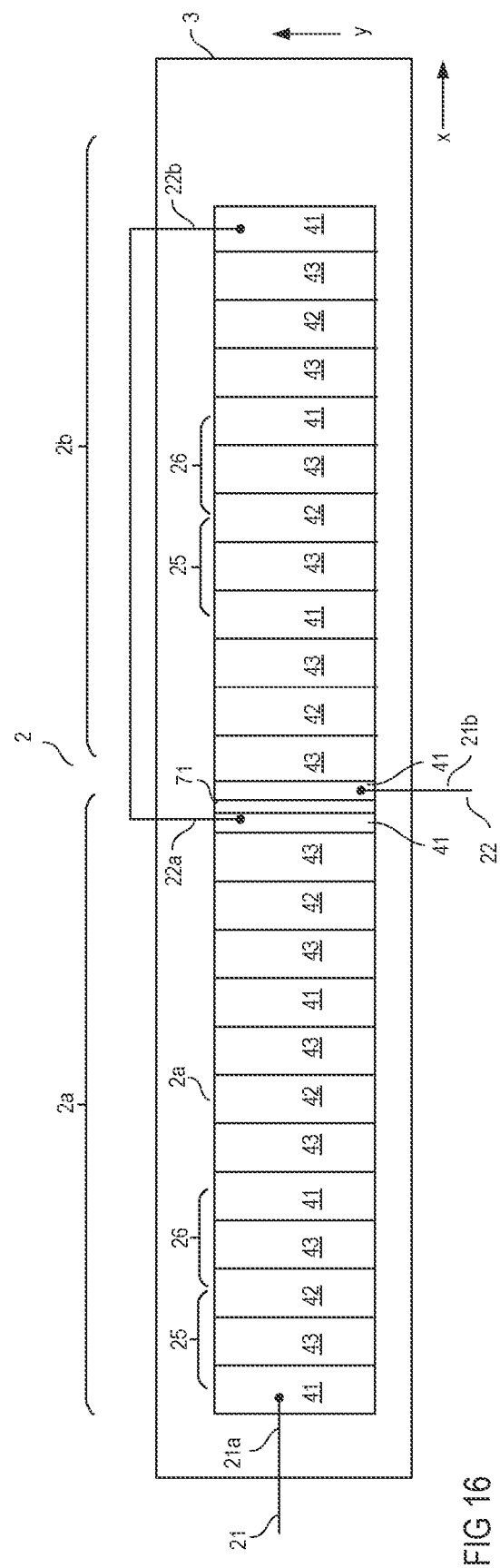

PROTECTION DEVICE WITH SPACE SAVING LAYOUT

TECHNICAL FIELD

This disclosure relates in general to a circuit arrangement, in particular a circuit arrangement with an electronic circuit integrated in a semiconductor body and at least one protection device, such as an electrostatic discharge (ESD) device.

BACKGROUND

There is a need to provide a circuit arrangement with an integrated electronic circuit and a protection device in which the protection device is implemented in a space saving way.

SUMMARY

One example relates to a method. The method includes forming a first diode arrangement including at least one first diode and at least one second diode connected in anti-series between a first circuit node and a second circuit node of the first diode arrangement, forming a second diode arrangement including at least one first diode and at least one second diode connected in anti-series between a first circuit node and a second circuit node of the second diode arrangement, and connecting the second circuit node of the first diode arrangement and the second circuit node of the second diode arrangement. Forming the first diode arrangement includes implanting first type dopant atoms into a first polysilicon layer in a first implantation process using a first implantation mask to form first implanted regions, and implanting second type dopant atoms into the first polysilicon layer in a second implantation process and using a second implantation mask to form at least one second implanted region, wherein the first implanted regions and the at least one second implanted region are arranged alternatingly in a first direction and are separated from one another by third regions of the first polysilicon layer. Forming the second diode arrangement includes implanting first type dopant atoms into a second polysilicon layer different from the first polysilicon layer in the first implantation process using the first implantation mask to form first implanted regions, and implanting second type dopant atoms into the second polysilicon layer in the second implantation process and using the second implantation mask to form at least one second implanted region, wherein the first implanted regions and the at least one second region are arranged alternatingly in the first direction and are separated by third regions of the second polysilicon layer. In each of the first and second diode arrangements, the respective second circuit node is spaced apart from the respective first circuit node in the first direction.

Another example relates to a protection device. The protection device includes a first diode arrangement and a second diode arrangement each including at least one first diode and at least one second diode connected in anti-series between a respective first circuit node and a respective second circuit node. The second circuit node of the first diode arrangement is connected to the second circuit node of the second diode arrangement. Each of the first and second diodes in the first and second diode arrangements includes a first doped region and second doped region that are separated by a third region. The first and second diodes of the first diode arrangement are integrated in a first polysilicon layer and the first and second diodes of the second diode arrangement are integrated in a second polysilicon layer. In the at least one first diode in each of the first and second diode arrangements, the second doped region is spaced apart from the first doped region in a first direction, and, in each of the first and second diode arrangements the respective second circuit node is spaced apart from the respective first circuit node in the first direction.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

FIGS. 14-16 illustrates different examples for implementing the two diode arrangements according to FIG. 13.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
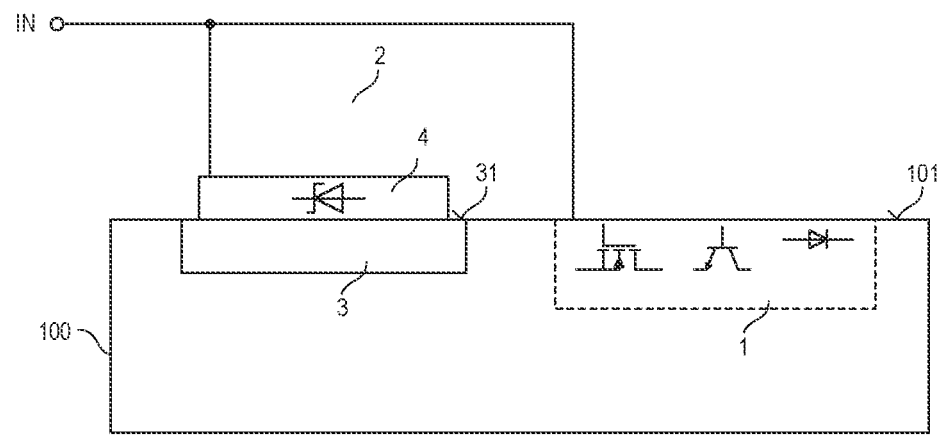
FIG. 1 schematically illustrates a circuit arrangement that includes an electronic circuit integrated in a semiconductor body, an input pin connected to the electronic circuit, and a protection device integrated in a polysilicon layer arranged on top of an insulation layer.

FIG. 1 illustrates one example of a protection device 2. The protection device 2 is integrated in a polysilicon layer 4. Referring to FIG. 1, the polysilicon layer 4 may be arranged on top of an insulation layer 3, wherein the insulation layer 3 may be formed on top of a semiconductor body 100.

Referring to FIG. 1, the protection device 2 may be part of a circuit arrangement which, in addition to the protection device 2, includes an electronic circuit 1 that is integrated in the semiconductor body 100. FIG. 1 schematically illustrates a vertical cross sectional view of the semiconductor body 100. The semiconductor body 100 includes a top surface 101. The section plane shown in FIG. 1 cuts through the semiconductor body 100 in a direction that is essentially perpendicular to the top surface 101 of the semiconductor body 100.

The integrated electronic circuit 1 may be any kind of electronic circuit that is capable of being integrated in a semiconductor body, such as the semiconductor body 100 illustrated in FIG. 1. The integrated circuit 1 may be implemented using any type of electronic devices that can be integrated in a semiconductor body. Examples of such electronic devices include, without being restricted to, transistors, e.g., MOSFETs (Metal Oxide Semiconductor Field-Effect Transistors), BJTs (Bipolar Junction Transistors); diodes; resistors; capacitors, or the like. Just for the purpose of illustration, a circuit symbol of a MOSFET, of a BJT and a diode is schematically illustrated in FIG. 1, wherein these devices represent electronic devices integrated in the electronic circuit 1. According to one example, the integrated electronic circuit is a CMOS circuit.

Referring to FIG. 1, the circuit arrangement may further include an input pin IN. The input pin IN, which is only schematically illustrated in FIG. 1, is connected to the electronic circuit 1 and the protection device 2. The protection device 2 may include one or more Zener or Avalanche diodes and is not illustrated in detail in FIG. 1. Examples for implementing the protection device 2 are explained in detail herein further below.

Referring to the above, the insulation layer 3 is formed on top of the semiconductor body 100. This includes that the insulation layer 3 is not entirely encapsulated by the semiconductor body 100, so that a surface on top of which the polysilicon layer 4 is formed is not covered by the semiconductor body 100. The insulation layer 3 may be arranged in a cavity (a trench) of the semiconductor body 100, so that a surface 31 of the insulation layer 3 and the top surface 101 of the semiconductor body 100 are essentially coplanar (as illustrated in FIG. 1). This, however, is only an example. According to another example (not illustrated), the insulation layer 3 is formed on top of the top surface 101 of the semiconductor body 100 by a deposition process. According to one example, the deposition process is a PECVD (Plasma Enhanced Vapor Deposition) process. According to yet another example (not shown), forming the insulation layer includes an oxidation process, so that a semiconductor oxide is formed as the insulation layer 3. In this example, the insulation layer 3 may extend into the semiconductor body 100 and, at the same time, may extend beyond the top surface 101 of the semiconductor body 100. According to one example, oxidation process is a LOCOS (Local Oxidation of Silicon) process.

According to one example, the semiconductor body 100 includes a monocrystalline semiconductor material such as, for example, silicon (Si), silicon carbide (SiC), gallium nitride (GaN), or the like. According to one example, the insulation layer 3 includes a semiconductor oxide, such as silicon oxide, or a nitride.

A thickness of the polysilicon layer 4, which is a dimension of the polysilicon layer 4 in a direction perpendicular to the surface 31 of the insulation layer 3, is selected from between 50 nanometers (nm) and 300 nanometers, in particular from between 100 nanometers and 200 nanometers.

A thickness of the insulation layer 3, which is the dimension of the insulation layer 3 in a direction perpendicular to the surface 31, is selected from between 50 nanometers and 500 nanometers, for example. According to one example, the thickness is selected from between 100 nanometers and 400 nanometers, in particular from between 100 nanometers and 200 nanometers.

Figure 2A:
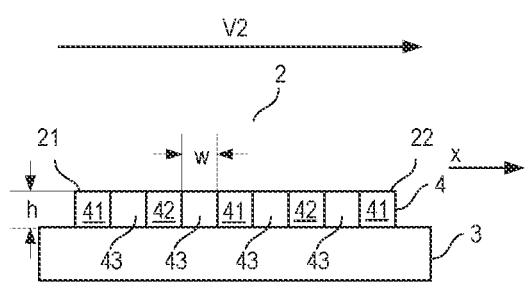
FIGS. 2A and 2B shows a protection device and a corresponding circuit diagram, respectively, of a protection device according to one example.
Figure 2B:
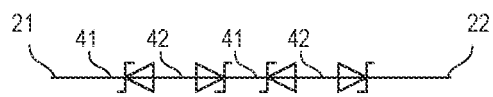

FIG. 2A illustrates one example of the protection device 2, FIG. 2B shows an equivalent circuit diagram of the protection device 2 according to FIG. 2A. FIG. 2A only illustrates the insulation layer 3 and the polysilicon layer 4 formed on top of the surface 31 of the insulation layer 3. The semiconductor body is not illustrated in FIG. 2A.

Referring to FIG. 2A, the protection device 2 includes a plurality of first regions 41 of a first doping type and a plurality of second regions 42 of a second doping type complementary to the first doping type. The first regions 41 and the second regions 42 are arranged alternatingly in a first lateral direction x of the polysilicon layer 4. According to one example, a doping concentration of each of the first and second regions 41, 42 is selected from between 1E19 cm$^{-3}$ and 1E21 cm$^{-3}$. Optionally, the protection device 2 further includes a plurality of third regions 43, wherein each of these third regions 43 is arranged between a first region 41 and a neighboring second region 42, so that each first region 41 is separated from each neighboring second region 42 by a respective third region 43 and each second region 42 is separated from each neighboring first region 41 by a respective third region 43.

According to one example, the third regions 43 are intrinsic regions. According to one example, "intrinsic" includes that the third regions 43 are non-doped or not intentionally doped polysilicon regions. According to the example, "non-doped or not intentionally doped" includes that the effective doping concentration is equal to or lower than 1E15 cm$^{-3}$.

According to another example, the third regions 43 are lowly doped regions. According to one example, lowly doped includes that there is an intentional doping, wherein the doping concentration is less than 1%, less than 0.1%, or less than 0.01% of the doping concentration of each of the first regions 41 and the second regions 42 and/or wherein the effective doping concentration is lower than 1E17 cm$^{-3}$ or lower than 1E16 cm$^3$.

One example for forming the polysilicon layer 4 with the first and second regions 41, 42 and the third regions 43 includes depositing a polysilicon layer on top of the insulation layer 3, forming the first regions 41, and forming the second regions 42. Forming the first regions 41 may include implanting dopant atoms of the first doping type into the polysilicon layer 4, and forming the second regions 42 may include implanting dopant atoms of the second doping type into the polysilicon layer 4. More specifically, forming the first regions 41 may include forming a first implantation mask on top of the polysilicon layer 4, wherein the first implantation mask does not cover those regions of the polysilicon layer 4 in which the first regions 41 are to be formed, and implanting first type dopant atoms into the polysilicon layer 4 via the openings in the first implantation mask. Equivalently, forming the second regions 42 may include forming a second implantation mask on top of the polysilicon layer 4, wherein the second implantation mask does not cover those regions of the polysilicon layer 4 in which the second regions 42 are to be formed, and implanting second type dopant atoms into the polysilicon layer 4 via respective openings in the second implantation mask. The third regions 43 are not doped when the first and second regions 41, 42 are formed, so that the third regions 43 have the basic doping of the polysilicon layer. The basic doping of the polysilicon layer is a doping concentration the polysilicon layer 4 has after depositing the polysilicon layer 4 on top of the insulation layer 3. According to one example, the polysilicon layer is an intrinsic layer, so that the third regions 43 are intrinsic regions. According to another example, the polysilicon layer is a lowly doped layer, so that the third regions 43 are lowly doped regions. Forming the first and second regions 41, 42 may further include a thermal process that activates the implanted dopant atoms of the first and second doping type.

Another example for forming the polysilicon layer 4 with the first and second regions 41, 42 and the third regions 43 is based on method explained above and additionally includes forming a third mask on top of those regions of the polysilicon layer that form the third regions 43 in the finished device. The third mask is formed before forming the first and second implantation masks and remains in place during the implantation processes that form the first and second regions 41, 42. The third mask acts as a blocking template and defines the geometry of the third regions 43, and is removed after forming the first and second regions 41, 42. Like in the method explained above, the third regions 43 are regions that have the basic doping of the polysilicon layer. According to one example, the polysilicon layer is an intrinsic layer, so that the third regions 43 are intrinsic regions. According to another example, the polysilicon layer is a lowly doped layer, so that the third regions 43 are lowly doped regions.

Another example for forming the polysilicon layer 4 with the first and second regions 41, 42 and the third regions 43 includes forming the third mask on top of those regions of the polysilicon layer that form the third regions 43 in the finished device. The method further includes a first implantation process in which dopant atoms of one of the first doping type and the second doping type are implanted into those regions of the polysilicon layer not covered by the third implantation mask. The method further includes forming one of the first and second implantation masks and implanting dopant atoms of the other one of the first and second dopant atoms, wherein an implantation dose in the second implantation process is higher than in the first implantation process, so that regions not covered by the implantation mask in the second implantation process change their effective doping type. According to one example, the implantation dose in the second implantation process is twice the implantation dose in the first implantation process, or higher.

According to one example, the first implantation process includes implanting dopant atoms of the first doping type and the second implantation process includes implanting dopant atoms of the second doping type. In this example, the second implantation mask is formed before the second implantation process, wherein the second implantation mask does not cover those regions of the polysilicon layer 4 in which the second regions 42 are to be formed. In this process, the first regions 41 are those regions that are covered by the second and third implantation masks in the second implantation process. A doping concentration of the first regions 41 is defined by a basic doping of the polysilicon layer and the implantation dose in the first implantation process, and a doping concentration of the second regions 42 is defined by the basic doping of the polysilicon layer, the implantation dose in the first implantation process, and the implantation dose in the second implantation process. Furthermore, the doping concentration of the third regions 43 is defined by the basic doping of the polysilicon layer. If, for example, the polysilicon layer is an intrinsic layer and the implantation dose in the second implantation process is twice the implantation dose in the first implantation process, the third regions 43 are intrinsic, the first regions 41 are regions of the first doping type, and the second regions 42 are regions of the second doping type, wherein an effective doping concentration of the second regions 42 essentially equals the effective doping concentration of the first regions 41.

According to another example, the first implantation process includes implanting dopant atoms of the second doping type and the second implantation process includes implanting dopant atoms of the first doping type. In this example, the first implantation mask is formed before the second implantation process, wherein the first implantation mask does not cover those regions of the polysilicon layer 4 in which the first regions 41 are to be formed. In this process, the second regions 42 are those regions that are covered by the first and third implantation masks in the second implantation process. A doping concentration of the second regions 42 is defined by a basic doping of the polysilicon layer and the implantation dose in the first implantation process, and a doping concentration of the first regions 41 is defined by the basic doping of the polysilicon layer, the implantation dose in the first implantation process, and the implantation dose in the second implantation process. Furthermore, the doping concentration of the third regions 43 is defined by the basic doping of the polysilicon layer. If, for example, the polysilicon layer is an intrinsic layer and the implantation dose in the second implantation process is twice the implantation dose in the first implantation process, the third regions 43 are intrinsic, the first regions 41 are regions of the first doping type, and the second regions 42 are regions of the second doping type, wherein an effective doping concentration of the second regions 42 essentially equals the effective doping concentration of the first regions 41.

In the examples explained before in which the first regions 41 or the second regions 42 include first and second type dopant atoms resulting from the first and second implantation process, the polysilicon layer is not necessarily an intrinsic layer. It is also possible to form the polysilicon layer as a lowly doped layer, wherein the dopant atoms are introduced either during the deposition process or by a blanket implantation process before forming the third implantation mask. The basic doping of the polysilicon layer may be considered in adjusting the implantation doses in the first and second implantation process in order to achieve a desired doping concentration of the first and second regions 41, 42. Furthermore, the order in which the first and second implantation processes are carried out is arbitrary.

According to another example, in the method explained above, the third implantation mask is omitted, so that the first implantation process is a blanket process in which dopant atoms are also implanted into those regions in which the third regions 43 are to be formed. This method further includes the second implantation process that uses the first or second implantation mask and that forms the first or second regions 41, 42. In addition to the second implantation process, this method further includes forming a further implantation mask that covers the first and second regions 41, 42 and does not cover those sections in which the third regions 43 are to be formed, and a third implantation process. A third implantation dose in the third implantation process is adjusted such that, given the dopant atoms that were implanted in the first implantation process, a desired doping concentration of the third regions 43 is achieved.

In the protection device 2 according to FIG. 2A, each arrangement including a first region 41, a neighboring second region 42, and the optional third region 43 arranged between the first region 41 and the second region 42 forms a Zener or Avalanche diode, wherein one of the first and second regions 41, 42 forms a cathode and the other one of the first region 41, and the second region 42 forms an anode of the respective Zener or Avalanche diode. According to one example, the first regions 41 are n-type regions and the second regions 42 are p-type regions, so that the first regions 41 form cathodes of the Zener or Avalanche diodes and the second regions 42 form anodes of the Zener or Avalanche diodes.

As can be seen from the equivalent circuit diagram shown in FIG. 2B, the plurality of first regions 41 and the plurality of second regions 42 and the optional third regions 43 form a series circuit with a plurality of Zener diodes wherein neighboring diodes in the series connection are connected in a back-to-back configuration. This includes, that the cathode of one Zener or Avalanche diode is connected to the cathode of the neighboring Zener or Avalanche diode or the anode of one Zener or Avalanche diode is connected to the anode of the neighboring Zener or Avalanche diode. This is due to each first region 41 being arranged between two second regions 42 forming the cathode of the two Zener or Avalanche diodes formed by the first region 41 and the two second regions 42, and, equivalently, each second region 42 being arranged between two first regions 41 forming the anode of two Zener or Avalanche diodes formed by the second region 42 and the two neighboring first regions 41.

Figure 3A:
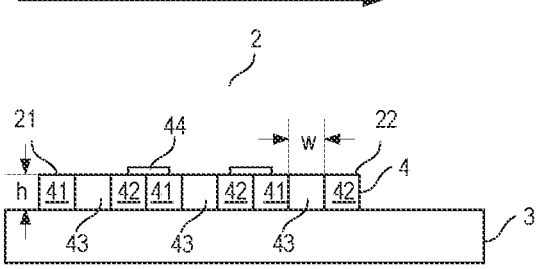
FIGS. 3A and 3B shows a protection device and a corresponding circuit diagram, respectively, of a protection device according to another example.
Figure 3B:
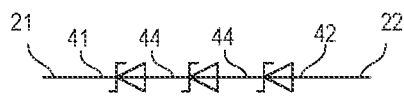

FIG. 3A shows a modification of the protection device 2 according to FIG. 2A, FIG. 3B shows an equivalent circuit diagram of the protection device 2 according to FIG. 3A. Referring to FIGS. 2A and 2B, each pair including a first region 41 and a neighboring second region 42 forms a Zener diode, so that, referring to FIG. 2B, the protection device includes a plurality of Zener diodes which are connected in a back-to-back configuration.

In the protection device 2 according to FIGS. 3A and 3B, every second Zener or Avalanche diode in the series circuit is bypassed (short-circuited), so that the protection device 2 effectively includes a series circuit with a plurality of Zener or Avalanche diodes which are orientated in the same way. That is, each of the Zener or Avalanche diodes in this series circuit has its anode connected to the cathode of another Zener or Avalanche diode and/or has its cathode connected to the anode of another Zener or Avalanche diode. Referring to FIG. 3A, bypassing a Zener or Avalanche diode may include electrically connecting the first region 41 and the second region 42 forming the respective Zener or Avalanche diode. "Electrically connecting" may include forming a conductor 44 on top of the respective first region 41 and the respective second region 42, wherein the conductor 44 ohmically contacts the first region 41 and the respective second region 42. According to one example, the conductor 44 includes at least one of a metal or a silicide. Examples of the metal include copper (Cu), aluminum (Al), titanium (Ti), tungsten (W), tantalum (Ta), cobalt (Co) or the like. Examples of the silicide include titanium silicide (TiSi), cobalt silicide (CoSi), nickel silicide (NiSi), or the like.

In the example shown in FIG. 3A, those first and second regions 41, 42 that are electrically connected by a respective conductor 44 adjoin each other. This, however, is only an example. According to another example (not illustrated) a third region is arranged between the first region 41 and the second region 42 that are electrically connected. In this example, the conductor 44 extends from the first region 41 along the third region 43 to the second region 42.

Referring to FIGS. 2A-2B and 3A-3B, the protection device 2 includes a first circuit node 21 and a second circuit node 22, wherein each of these circuit nodes 21, 22 may be formed by a respective one of the first regions 41 or a respective one of the second regions 42.

The protection device 2 has a voltage blocking capability and is capable of conducting a current between the first circuit node 21 and the second circuit node 22 when a voltage between the first circuit node 21 and the second circuit node 22 reaches a voltage level defined by the voltage blocking capability. For the purpose of illustration it is assumed that a voltage V2 is applied between the first circuit node 21 and the second circuit node 22. This voltage V2 may have a first polarity or an opposite second polarity. Just for the purpose of illustration it is assumed that the first polarity is associated with an electrical potential at the first circuit node 21 being higher than an electrical potential at the second circuit node 22, and that the second polarity is associated with the electrical potential at the second circuit node 22 being higher than the electrical potential at the first circuit node 21. Dependent on the implementation, the protection device 2 may block the voltage V2 independent of its polarity or may block only when the voltage V2 has one of the first and second polarities and conduct when the voltage V2 has the other one of the first and second polarities.

A protection device configured to block the voltage V2 independent of its polarity is referred to as bidirectionally blocking protection device in the following. Equivalently, a protection device that is configured to block only a voltage with one polarity is referred to as unidirectionally blocking protection device in the following.

The protection device according to FIGS. 2A-2B that includes a plurality of Zener or Avalanche diodes connected in a back-to-back configuration is a bidirectionally blocking protection device. In this protection device, a first group of Zener diodes is reverse biased and a second group of Zener diodes is forward biased when the voltage V2 has the first polarity. Equivalently, the Zener diodes of the second group are reverse biased and the Zener diodes of the first group are forward biased when the voltage V2 has the second polarity. When the voltage V2 has the first polarity, the voltage blocking capability of the protection device 2 is essentially given by the sum of the voltage blocking capabilities of the Zener diodes of the first group. Equivalently, when the voltage V2 has the second polarity, the voltage blocking capability of the protection device 2 is essentially given by the sum of the voltage blocking capabilities of the Zener diodes of the second group.

The protection device 2 according to FIGS. 3A-3B is a unidirectionally blocking protection device. More specifically, the protection device 2 only blocks when the voltage V2 has the first polarity. The voltage blocking capability is given by the sum of the voltage blocking capabilities of the (not short circuited) Zener or Avalanche diodes in the series circuit. The protection device 2 according to FIGS. 3A-3B conducts when the voltage V2 has the second polarity and has a voltage level that is higher than a sum of the forward voltages of the Zener or Avalanche diodes.

In each case, when one of the protection devices 2 according to FIG. 2A-2B or 3A-3B is operated in a blocking state, the protection device 2 breaks through and conducts a current when a voltage level of the voltage V2 reaches the respective voltage blocking capability. In this way, the protection device 2 clamps the voltage level of the voltage V2 and prevents the voltage from increasing further. The "blocking state", is the operating state in which Zener or Avalanche diodes in the series circuit are reverse biased.

Referring to the above, the voltage blocking capability of the protection device 2 is given by the sum of the voltage blocking capabilities of the Zener or Avalanche diodes that are reverse biased in the respective operating state of the protection device 2. The voltage blocking capability of a singular Zener or Avalanche diode can be adjusted by suitably selecting a width w of the third region 43 separating the first region 41 and the second region 42 of the respective Zener or Avalanche diode. Basically, the voltage blocking capability increases as the distance w increases. It can be shown that, for a certain range of the width w, the voltage blocking capability of the Zener or Avalanche diode linearly increases dependent on the width w. Referring to the above, it may be desirable for the protection device 2 to break through and conduct a current between the first and second circuit nodes 21, 22 when the voltage V2 reaches a voltage level defined by the voltage blocking capability of the protection device 2. Such voltage level may result from an ESD event, for example.

It may further be desirable that the protection device 2 features a low resistance between the first circuit node 21 and the second circuit node 22 when the voltage V2 reaches the voltage level defined by the voltage blocking capability (that is, when the voltage V2 reaches the breakdown voltage). Basically, the current through a reverse biased Zener diode increases exponentially when the voltage across the Zener diode reaches the breakdown voltage and further increases. It can be shown that the increase of the voltage through the Zener diode is dependent on the width w of the third region 43 wherein the higher the width w, the lower the increase of the current through the Zener diode. Furthermore, it can be shown that a protection device having a certain voltage blocking capability and being capable of conducting a certain current after the voltage blocking capability (the breakdown voltage) has been reached can be implemented in a space saving way when implementing several Zener diodes connected in series, as compared to implementing only one Zener diode with a relatively wide third region.

According to one example, the voltage blocking capability of each Zener or Avalanche diode is between 5V and 10V. According to one example, an overall voltage blocking capability of the protection device is between 10V and 300V, in particular between 100V and 220V.

According to one example, the protection device 2 includes between 3 and 30 first regions 41, and 3 and 30 second regions 42, so that the protection device 2 includes between 3 and 30 Zener or Avalanche diodes in a protection device according to FIG. 3 or between 6 and 60 Zener or Avalanche diodes in a protection device according to FIG. 2. According to one example, the width w of each of the third regions 43 is selected from between 0.1 micrometers (μm) and 1 micrometer, in particular from between 0.1 micrometers and 0.4 micrometers. The width of the first and second regions 41, 42 may be selected from the same range as the width of the third regions 43.

When the voltage V2 applied between the first and second circuit nodes 21, 22 reaches the breakdown voltage and a current flows through the protection device 2 energy may be dissipated in the polysilicon layer 4, wherein this may cause the polysilicon layer 4 to heat up. According to one example, the protection device 2 includes cooling fins that serve to conduct heat away from the polysilicon layer 4. Examples of how such cooling fins may be implemented are illustrated in FIGS. 4 and 5, wherein each of these Figures shows a vertical cross sectional view of the insulation layer 3, the polysilicon layer 4, and the respective cooling fins.

Figure 4:
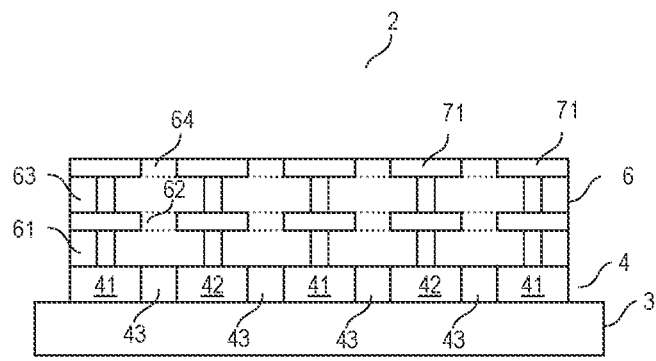
FIG. 4 shows a modification of the protection device according to FIG. 2A.
Figure 5:
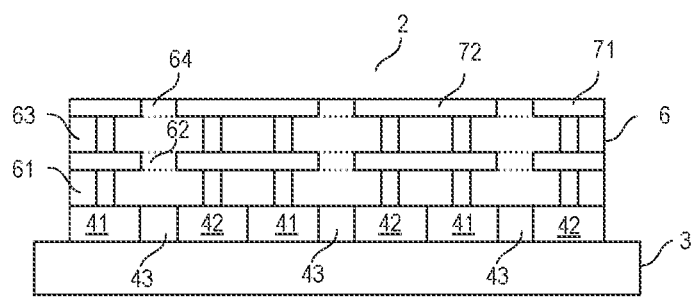
FIG. 5 shows a modification of the protection device according to FIG. 3A.

The protection device 2 according to FIG. 4 includes a plurality of cooling fins 71, wherein each of these cooling fins adjoins a respective one of the first regions 41 and the second regions 42, and wherein the cooling fins 71 are electrically insulated from each other. In the example shown in FIG. 4, each of the first and second regions 41, 42 has a cooling fin 71 attached thereto. This, however, is only an example. According to another example (not shown) at least one but less than each of the first and second regions 41, 42 has a respective cooling fin 71 attached thereto.

Referring to FIG. 4, each of the cooling fins 71 adjoins a respective one of the first and second regions 41, 42. Each of the cooling fins 71 includes a thermally conductive material. According to one example, the cooling fins 71 include a metal such as, copper, aluminum, tungsten, titanium, tantalum or the like. Each of the cooling fins 71 may include only one type of metal. According to another example, each cooling fin 71 includes two or more sections or layers that include different types of metals.

Referring to FIG. 4, the cooling fins 71 may be arranged in an insulation layer 6 formed on top of the polysilicon layer 4. The insulation layer 6 may include several sublayers 61-64. In this example, each cooling fin 71 may include several sections, wherein these sections are thermally (and electrically) connected, and wherein each of these sections is arranged in a respective one of the sublayers 61-64. According to one example, the cooling fins 71 are formed by the same process in which a wiring arrangement of the integrated circuit is formed on top of the semiconductor layer 100. The wiring arrangement may include several metallization layers, wherein the metallization layers may be connected by electrically conducting vias. Consequently, the cooling fin 71 may include sections that are formed by metallization layers of the wiring arrangement and other sections that are formed by electrically conducting vias. According to one example, sublayers 62, 64 shown in FIG. 4 are sublayers of the insulation layer that include metallization layers of the wiring arrangement, and sublayers 61, 63 are layers that include electrically conducting vias. Consequently, in the example shown in FIG. 4, the cooling fins 71 include sections of two different metallization layers and two electrically conducting vias that connect the sections of the metallization layer with each other and with the respective first or second region 41, 42, respectively.

FIG. 5 illustrates cooling fins according to another example. In this example, the protection device 2 includes cooling fins 72 that electrically connect a first region 41 and a second region 42. In this example, each cooling fin 72, in addition to conducting heat away from the first and second regions 41, 42 it is connected thereto, has the same function as the connection 44 according to FIG. 3A and therefore serves to bypass (short circuit) a respective Zener or Avalanche diode.

Figure 6:
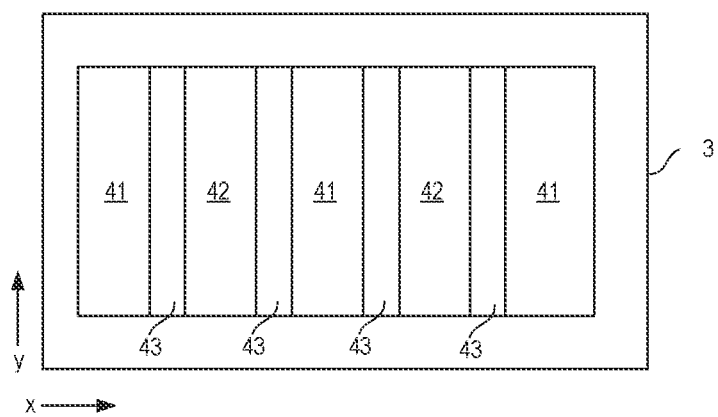
FIG. 6 shows a top view of a protection device according to one example.

Referring to the above, the first and second regions 41, 42 are arranged alternatingly in the first lateral direction x. In a second lateral direction y perpendicular to the first lateral direction x, the first and second regions 41, 42 may be elongated. That is, a dimension of the first and second regions 41, 42 in the second lateral direction y may be greater than a respective dimension in the first lateral direction x. This is schematically illustrated in FIG. 6 which shows a top view of the polysilicon layer 4 and the insulation layer 3. Equivalently, the third regions 43 may be elongated in the second lateral direction y. According to one example, a dimension of each of the first, second, and third regions 41, 42, 43 in the second lateral direction y is selected from between 1 micrometer and 300 micrometers, in particular between 10 micrometers and 100 micrometers. Basically, the greater the dimension in the second direction y, the higher the current that can flow through the protection device 2 when a voltage breakdown occurs.

Figure 7:
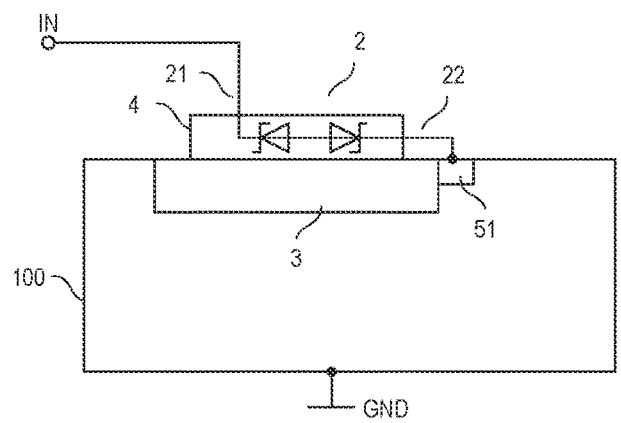
FIG. 7 illustrates one example for coupling a protection device to the semiconductor body.

According to one example illustrated in FIG. 7, the protection device 2 is connected between the input pin IN and a doped contact region 51 of the semiconductor body 100. More specifically, in the example shown in FIG. 7, the input pin IN is connected to the first circuit node 21 and the contact region 51 is connected to the second circuit node 22 of the protection device 2. The protection device 2 may be implemented as bidirectionally blocking protection device (as schematically illustrated in FIG. 7) or as a unidirectionally blocking protection device 2. According to one example, the semiconductor body 100 has a basic doping of a certain doping type, wherein a region of the semiconductor body 100 having the basic doping is connected to a ground node GND. According to one example, the contact region 51 has the same doping type as the basic doping and may have a higher doping concentration than the basic doping.

In the electronic circuit according to FIG. 7, when a voltage pulse occurs at the input node IN that causes a voltage between the input node IN and the ground node GND to reach a voltage level that is higher than the breakdown voltage of the protection device 2 a breakdown occurs in the protection device 2 between the first circuit node 21 and the second circuit node 22, so that a current flows from the input pin IN via the protection device 2, the doped region 51 and the semiconductor body 100 to the ground node GND and prevents the voltage between the input node IN and the ground node GND from increasing further. The current direction is dependent on a polarity of the voltage pulse received at the input pin. The voltage pulse may be a positive pulse, which is a pulse having a potential higher than ground potential, or a negative pulse, which is a pulse having a potential lower than ground potential.

In the electronic circuit according to FIG. 7, when the electrical potential at the input node IN is different from the electrical potential at the ground node GND, there is not only a voltage across the protection device 2 between the first circuit node 21 and the second circuit node 22, but also across the insulation layer 3, wherein the maximum voltage occurs between a region of the polysilicon layer 4 where the first circuit node 21 is located and between regions of the semiconductor body 100 below the insulation layer 3.

Figure 8:
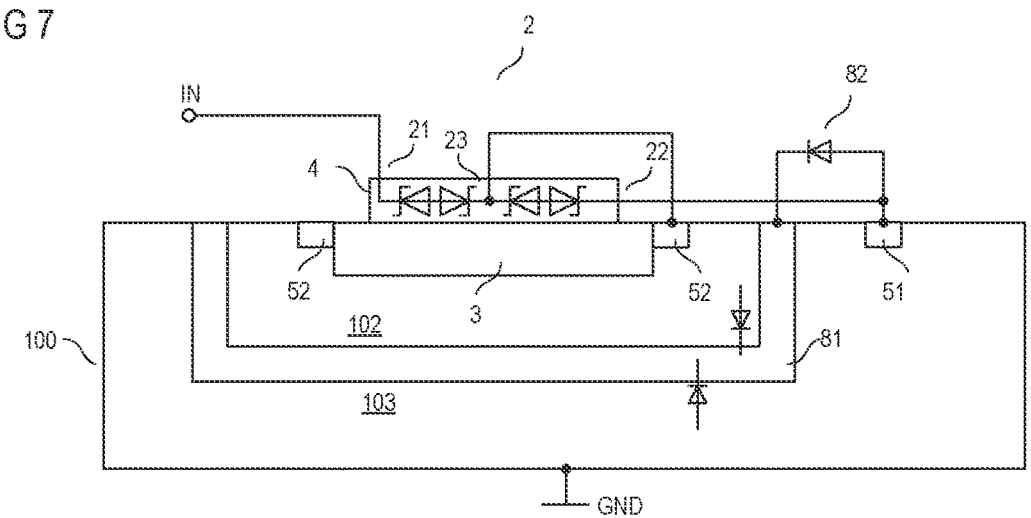
FIG. 8 illustrates another example for coupling a protection device to the semiconductor body.
Figure 9:
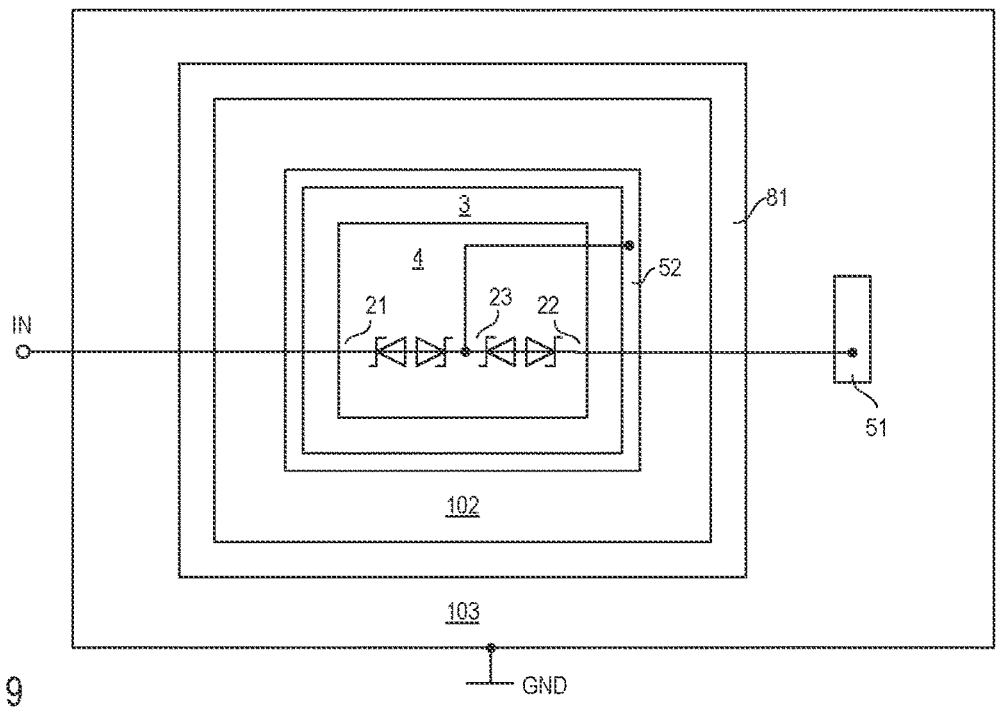
FIG. 9 shows a top view of the arrangement shown in FIG. 8.

FIGS. 8 and 9 show a modification of the electronic circuit according to FIG. 7, wherein in the example according to FIGS. 7 and 8 the maximum voltage across the insulation layer 3 is reduced. FIG. 8 shows a vertical cross sectional view of the semiconductor body 100 in a region where the protection device 2 is arranged, and FIG. 9 schematically shows a top view of the semiconductor body 100.

In the example shown in FIGS. 8 and 9, the protection device 2 includes a tap 23 that is arranged between the first circuit node 21 and the second circuit node 22 and that subdivides the protection device 2 in a first protection device arranged between the first circuit node 21 and the tap 23 and a second protection device arranged between the tap 23 and the second circuit node 22. Each of the first and second protection device may be a bidirectionally blocking device (as illustrated in FIGS. 8 and 9) or a unidirectionally blocking protection device. The protection device may be implemented in accordance with any of the examples illustrated in FIGS. 2A-2B and 3A-3B, wherein the tap 23 may be formed by one of the first regions 41 and the second regions 42.

Referring to FIGS. 8 and 9, the second circuit node 22 of the protection device 2 is connected to the contact region 51, which is also referred to as first contact region 51 in the following, and the tap 23 is connected to a further contact region 52, which is also referred to as second contact region 52 in the following. Furthermore, the circuit arrangement includes a doped region 8 of a doping type complementary to the doping type of the basic doping of the semiconductor body 100. The doped region 8, which is referred to as well region 8 in the following, separates a first section 102 having the basic doping type of the semiconductor body 100 from a second section 103 having the basic doping type. The further contact region 52 is arranged in the first section 102. Furthermore, the insulation layer 3 adjoins the first section 102 or is arranged within the first section 102. The contact region 51 is arranged in the second region 103 of the semiconductor body 100. In this arrangement, a first pn junction is formed between the well region 8 and the first section 102 and a second pn junction is formed between the well region 8 and the second section 103.

In the circuit arrangement according to FIGS. 8 and 9, the electrical potential of the first section 102 essentially equals the electrical potential at the tap 23 of the protection device 2, while the electrical potential of the second section 103 essentially equals ground potential. In this arrangement, the maximum voltage across the insulation layer 3 is given by the voltage between the input node IN and the tap 23, while the voltage between the tap 23 and the second circuit node 22 is absorbed by one of the pn junctions between the well region 8 and the first section 102 or the well region 8 and the second section 103.

According to one example, the tap 23 is located in the protection device 2 such that a voltage blocking capability of the first and second protection devices is lower than the voltage blocking capability between the contact regions 51, 52. Dependent on the specific implementation of the protection device 2, the voltage blocking capabilities of the first and second protection devices may be essentially equal or may be different from each other. According to one example, an overall voltage blocking capability of the protection device 2 is selected from between 10V and 300V. In the event that the voltage blocking capabilities of the first and second protection devices are equal, the voltage blocking capability of each of the first protection device and the second protection device is between 5V and 150V.

The pn junctions between the well region 8 and the first and second sections 102, 103 are represented by diodes in the example shown in FIGS. 8 and 9. The polarity of these diodes is based on the assumption that the doping type of the first and second sections 102, 103 is a p-type and the doping type of the well region is an n-type. This, however, is only an example. According to another example, the doping type of the first and second sections 102, 103 is an n-type and the doping type of the well region is a p-type.

Optionally, the circuit arrangement further includes a further diode 82 connected between the first contact region 51 and the well region 81. This optional diode 82 has a polarity such that the electrical potential of the well region 81 is essentially clamped to the electrical potential of the first contact region 51 plus the forward voltage of the optional diode. In the example shown in FIG. 8 this is achieved by connecting the anode of the further diode 82 to the first contact region 51 and connecting the cathode of the further diode 82 to the well region 81. The further diode 82 may be implemented as polysilicon diode on top of an insulation layer, wherein the further diode may include only one first region forming the cathode, only one second region forming the anode and, optionally, a third region arranged between the anode and the cathode. The insulation layer may be the same insulation layer as the insulation layer on top of which the protection device 2 is formed, or a different insulation layer.

According to another example (not shown), diode 82 is connected between the first contact region 51 and the well region 81 such that the anode of diode 82 is connected to the well region and the cathode is connected to the first contact region 51. In this example, diode 81 limits (clamps) a voltage between the contact region 51 and the well region 81 to a voltage level that is given by a breakdown voltage of the diode 82.

Figure 10:
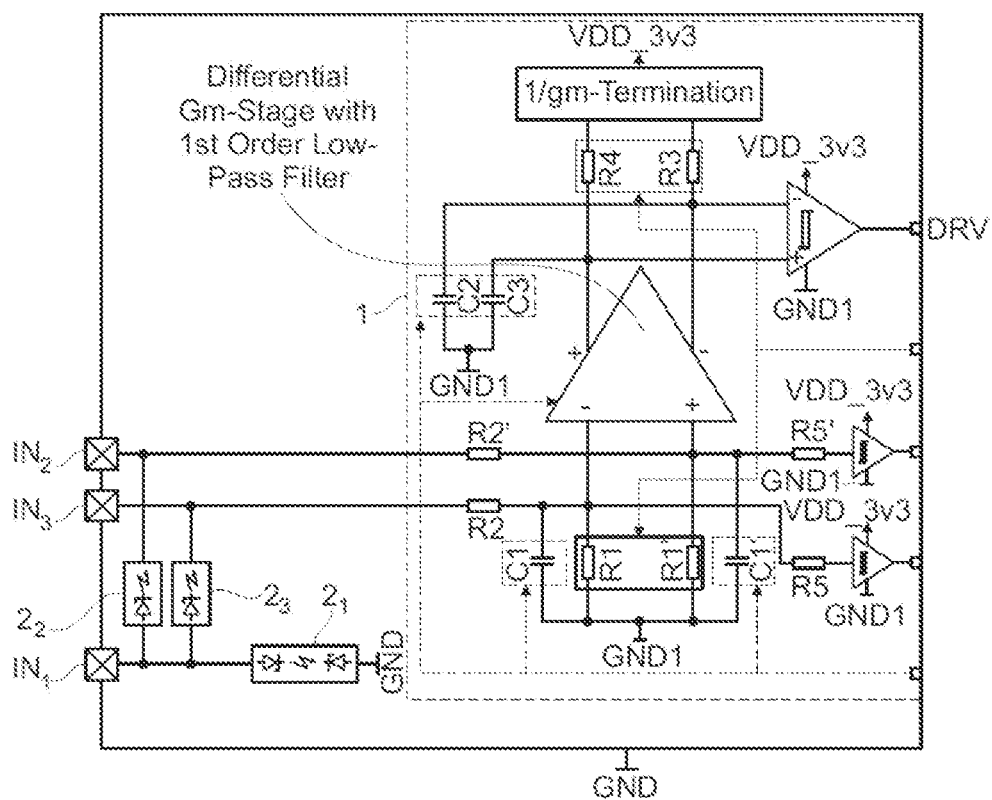
FIG. 10 shows one example of a circuit arrangement with an electronic circuit and several protection devices.

FIG. 10 illustrates an equivalent circuit diagram of a circuit arrangement according to one example. In this circuit arrangement, the electronic circuit 1 integrated in the semiconductor body includes a CMOS circuit with a differential amplifier (differential stage).

Referring to FIG. 10, the circuit arrangement includes three input pins $IN_1$, $IN_2$, $IN_3$, wherein the first and second input pins $IN_2$, $IN_3$ are configured to receive a differential input signal. More specifically, a second input pin $IN_2$ is configured to receive a first input signal referenced to a first input pin $IN_1$ and a third input pin $IN_3$ is configured to receive a second input signal that is also referenced to the first input pin $IN_1$, wherein the first and second input signals form a differential signal pair. According to one example, a first protection device $2_1$ is connected between the first input pin $IN_1$ and the ground node GND of the semiconductor body 100 (which is not shown in FIG. 10), a second protection device $2_2$ is connected between the second input pin $IN_2$ and the first input pin $IN_1$, and a third protection device $2_3$ is connected between the third input pin $IN_3$ and the first input pin $IN_1$.

According to one example, the first protection device $2_1$ is a bidirectionally blocking protection device, wherein the voltage blocking capability of this protection device is selected from between 50V and 200V. According to one example, each of the first and second protection devices $2_2$, $2_3$ is a unidirectionally blocking protection device, wherein polarities of these protection devices are such that they prevent electrical potentials at the second and third input nodes $IN_2$, $IN_3$ from increasing to above voltage blocking capabilities as defined by the first and second protection devices $2_2$, $2_3$. According to one example, voltage blocking capabilities of the first and second protection devices are selected from between 5V and 30V, for example.

In the example shown in FIG. 10, the electronic circuit 1 is a drive circuit that is configured to output a drive signal DRV that may be received by a high side switch (not shown) of a half-bridge. In addition to the high-side switch, the half-bridge includes a low-side switch (not shown) connected in series with the high-side switch. Each of the high-side switch and the low side switch is an n-type MOSFET (Metal Oxide Semiconductor Field-Effect Transistor), for example According to one example, the drive signal DRV is a voltage that is referenced to a further ground node GND1, which is different from the ground node GND explained above. The drive circuit 1 is configured to generate the drive signal DRV based on a differential signal, which includes a first input voltage received between the second input node $IN_2$ and the first input node $IN_2$, and a second input voltage received between the third input node $IN_3$ and the first input node $IN_1$, wherein the drive circuit 1 includes a level shifter functionality so that the drive signal DRV is referenced to the ground node GND1 that is different from (and higher than) the ground node coupled to the first, second, and third input nodes $IN_1$, $IN_2$, $IN_3$.

Figure 11:
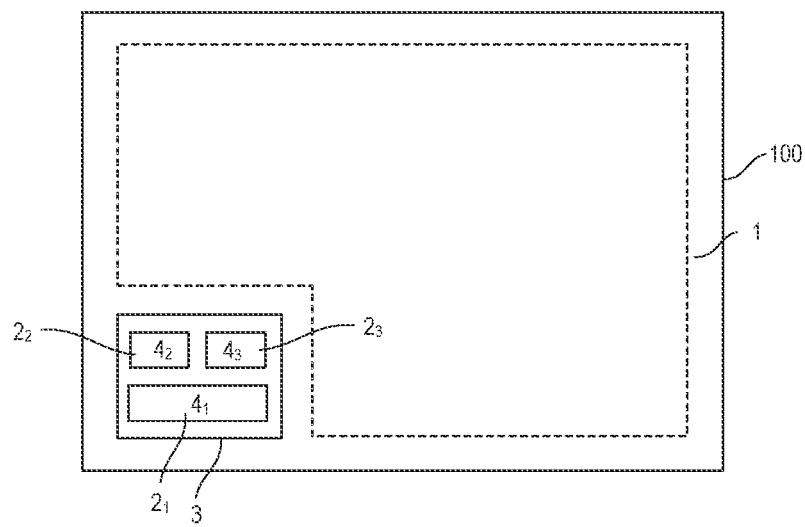
FIG. 11 schematically illustrates a top view of a semiconductor body of the arrangement shown in FIG. 10.

FIG. 11 schematically illustrates a top view of the semiconductor body 100, wherein FIG. 11 illustrates where the electronic circuit 2 and the protection devices may be arranged. In the example shown in FIG. 11, the first protection device 21 is integrated in a first polysilicon layer $4_1$, the second protection device $2_2$ is integrated in a second polysilicon layer $4_2$, and the third protection device $4_3$ is integrated in a third polysilicon layer $4_3$. These polysilicon layers $4_1$, $4_2$, $4_3$ may be arranged on top of the same insulation layer 3 and are spaced apart from each other. The insulation layer 3 may be arranged in a section of the semiconductor body 100 that is spaced apart from those sections in which the electronic circuit 1 is integrated. Each of the first, second and third protection devices $4_1$, $4_2$, $4_3$ may be implemented in accordance with any of these examples explained herein before.

Forming the protection devices $2_1$-$2_3$ in separate polysilicon layers $4_1$-$4_3$ on top of the same insulation layer 3 is only an example. According to another example, the circuit arrangement includes several insulation layers that are spaced apart from each other, wherein each of the polysilicon layers $4_1$-$4_3$ is formed on a respective one of these insulation layers.

One of the methods summarized above for forming a protection device 2 according to FIG. 2A is explained in detail with regard to FIGS. 12A-12D in the following. Each of FIGS. 12A-12D shows a vertical cross-sectional view of the insulation layer 3 and the polysilicon layer 4 formed on top of the insulation layer 3 during different steps of the manufacturing process.

Figure 12A:
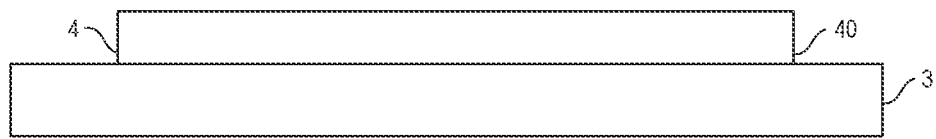
FIGS. 12A-12D illustrate one example of a method for forming a protection device.

Referring to FIG. 12A, the method includes forming the polysilicon layer 4 on top of the insulation layer 3. According to one example, the polysilicon layer 4 is formed such that a basic doping concentration of the polysilicon layer 4 corresponds to a desired doping concentration of the third regions 43 in the finished protection device 2. The polysilicon layer 4 having the basic doping concentration is also referred to as basic polysilicon layer 40 in the following. According to one example, the doping of the basic polysilicon layer 40 is as low as intrinsic.

Forming the basic polysilicon layer 40 may include depositing the basic polysilicon layer 40 all over the carrier 3 and patterning the polysilicon layer formed all over the carrier 3 in order to form the basic polysilicon layer 40. Patterning the polysilicon layer includes patterning the polysilicon layer such that the basic polysilicon layer 40 has a desired position and size on top of the carrier 3. Patterning the polysilicon layer may include an etching process, for example. Processes for forming a polysilicon layer on top of a carrier and patterning the polysilicon layer are commonly known, so that no further explanation is required in this regard.

Figure 12B:
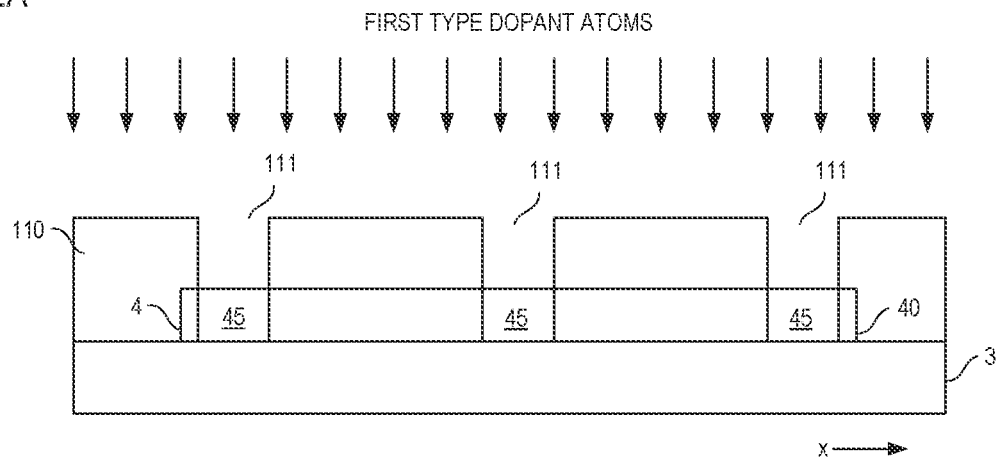

Referring to FIG. 12B, the method further includes forming the first implantation mask 110 such that the first implantation mask 110 partially covers the basic polysilicon layer 40 and leaves uncovered, in openings 111, only those sections of the basic polysilicon layer 40 into which the dopant atoms of the first doping type (first type dopant atoms) are to be implanted. After forming the first implantation mask 110, the method further includes implanting the first type dopant atoms into the basic polysilicon layer 40 in a first implantation process. In the first implantation process, the first type dopant atoms are implanted into the basic polysilicon layer 40 through the openings 111 in the first implantation mask 110 to form first implanted regions 45. Sections of the basic polysilicon layer 40 covered by the first implantation mask 110 are protected from having first type dopant atoms implanted therein. Thus, the position and the size of the openings 111 in the first implantation mask 110 defines the position and size of the first implanted regions 45.

Figure 12C:
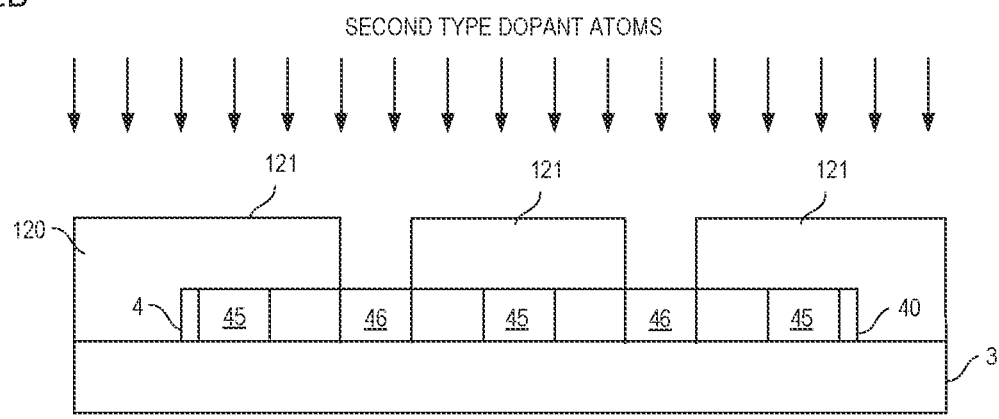

Referring to FIG. 12C, the method further includes forming the second implantation mask 120 such that the second implantation mask 120 partially covers the basic polysilicon layer 40 and leaves uncovered, in openings 121, only those sections of the basic polysilicon layer 40 into which the dopant atoms of the second doping type (second type dopant atoms) are to be implanted. After forming the second implantation mask 120, the method further includes implanting the second type dopant atoms into the basic polysilicon layer 40 in a second implantation process. In the second implantation process, the second type dopant atoms are implanted into the basic polysilicon layer 40 through the openings 121 in the second implantation mask 120 to form second implanted regions 46. Sections of the basic polysilicon layer 40 covered by the second implantation mask 120 are protected from having first type dopant atoms implanted therein. Thus, the position and the size of the openings 121 in the second implantation mask 120 defines the position and size of the second implanted regions 46.

In each of the first implantation process, in which the first type dopant atoms are implanted, and the second implantation process, in which the second type dopant atoms are implanted, the respective implantation dose is the selected dependent on a thickness of the basic polysilicon layer and a desired doping concentration of the first and second regions 41, 42. The respective doping concentration is essentially given by the respective doping dose divided by the thickness of the basic polysilicon layer 40. Referring to the above, the first and second regions 41, 42 may be formed to have a respective doping concentration in the range of between $1E19 \text{ cm}^{-3}$ and $1E21 \text{ cm}^{-3}$.

According to one example, the first and second implantation masks 110, 120 are conventional implantation masks for implanting dopant atoms into a semiconductor layer, such as a polysilicon layer. Example of such implantation masks include resist masks or oxide masks. Each of these masks may be formed by depositing a respective mask layer and patterning the mask layer using a lithographic process.

In the example explained with reference to FIGS. 12A-12D, the first implantation mask 110 is used to implant the first type dopant atoms and the second implantation mask 120 is used to implant second type dopant atoms. This, however, is only an example. According to another example (not illustrated) the first implantation mask 110 is used to implant second type dopant atoms, and the first implantation mask 120 is used to implant the first type dopant atoms. Furthermore, the second implanted regions 46 can be formed using the second implantation mask 120 before forming the first implanted regions 45 using the first implantation mask 110.

Figure 12D:
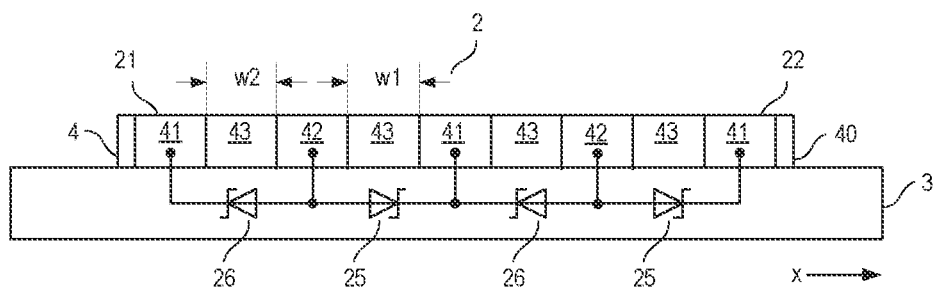

Referring to FIG. 12D, the method further includes a thermal process that causes the first type dopant atoms included in the first implanted regions 45 and the second type dopant atoms included in the second implanted regions 46 to be electrically activated, so that the first and second regions 41, 42 are formed. It should be noted that the thermal process may cause the first and second type dopant atoms to diffuse in the polysilicon layer 4. Thus, in the first lateral direction x, the first regions 41 may be wider than the first implanted regions 45, and the second regions 46 may be wider than the second implanted regions 46. This, however, is not illustrated in the drawings. According to one example, the temperature in the thermal process is selected from between 1000° C. and 1100° C. The duration of the thermal process is several seconds, for example, such as between 1 second and 15 seconds.

As explained above, a diode is formed by each pair including a first region 41 and a second region 42, and by the third region 43 formed between the first region 41 and the second region 42. FIG. 12D, in addition to the vertical cross-sectional view of the insulation layer 3 and the polysilicon layer 4, illustrates an equivalent circuit diagram of a diode arrangement formed by the first, second and third regions 41, 42, 43 integrated in the polysilicon layer 4 and being part of the protection device 2.

Referring to the equivalent circuit diagram, the diode arrangement includes two types of diodes, first type diodes 25, briefly referred to as first diodes 25, and second type diodes 26, briefly referred to as first diodes 26. First diodes 25 are diodes that each include a pair with a first region 41 and a second region 42, wherein the first region 41 is spaced apart from the second region 42 in the first direction x. Second diodes 26 are diodes that each include a pair with a first region 41 and a second region 42, wherein the second region 42 is spaced apart from the first region 41 in the first direction x. Just for the purpose of illustration, in the example illustrated in FIG. 12D, the first regions 41 are n-type regions and the second regions 42 are p-type regions. In this example, the first diodes 25 are diodes in which the cathode (formed by the respective first region 41) faces the second circuit node 22 of the protection device 2 and the anode (formed by the respective second region 42) faces the first circuit node 21 of the protection device 2. Equivalently, the second diodes 26 are diodes in which the anode (formed by the respective second region 42) faces the second circuit node 22 of the protection device 2 and the cathode (formed by the respective first region 41) faces the first circuit node 21 of the protection device 2.

Each of the first and second diodes 25, 26 has a breakdown voltage, which is given by the magnitude of a voltage applied between the cathode and the anode and causing an Avalanche breakdown of the respective diode. Referring to the above, the breakdown voltage of each diode is dependent on the distance between the first and second regions 41, 42 in the respective diode. That is, the breakdown voltage is dependent on the width (dimension) of the third region 43 of the respective diode in the first direction x.

In the process of forming the second implanted regions 46 illustrated in FIG. 12C, in an ideal case, the second implantation mask 120 is aligned with respect to the first implanted regions 45 such that each of the second implanted regions 46 is located in the middle between two first implanted regions 45. In this case, the distance between the second implanted region 46 and the one of the neighboring first regions 45 that is spaced apart from the second region 46 in the first direction x is the same as the distance between the second implanted region 46 and the one of the neighboring first regions 45 that is spaced apart from the second region 46 in a direction opposite the first direction x.

However, an error may occur in the alignment of the second implantation mask 120 relative to the first implanted regions 45. Such error which may also be referred to as misalignment error, may have the effect that in the finished diode arrangement a first distance w1 (see, FIG. 12C) between a second region 42 and a first neighboring first region 41 is different from a second distance w2 (see, FIG.

12C) between the second region 42 and a second neighboring first region 41. The "first neighboring first region 41" is the first region 41 spaced apart from the second region 42 in the first lateral direction x, and the "second neighboring first region 41" is the first region 41 spaced apart from the second region 42 in the direction opposite to the first direction x.

The first distance w1 equals the width of the third region 43 included in the respective first diode 25. Equivalently, the second distance w2 equals the width w2 of the third region 43 included in the respective second diode 26. As the first and second distances w1, w2 define the breakdown voltages of the respective first and second diodes 25, 26, a misalignment error may have the effect that a first diode and a second diode that have the same second region 42 have different breakdown voltages. In the event that the second implantation mask 120 is shifted in the first direction x relative to an ideal position, the first diode 25 has a lower breakdown voltage than the second diode 26. In the event that the second implantation mask 120 is shifted opposite to first direction x relative to the ideal position, the second diode 26 has a lower breakdown voltage than the first diode 25. When the second implantation 120 is located at the "ideal position" the second implanted regions 46 are formed in the middle between respective neighboring first implanted regions 45, so that first and second diodes 25, 26 that share the same second region 42 (resulting from a respective second implanted region 46) have the same breakdown voltage.

A misalignment error may have the effect that an overall breakdown voltage of the protection device 2 deviates from a desired breakdown voltage. More specifically, a first breakdown voltage, which is given by a sum of the breakdown voltages of the first diodes 25 and which is relevant when a positive voltage is applied between the second circuit node 22 and the first circuit node 21, deviates from a desired first breakdown voltage. Equivalently, a second breakdown voltage, which is given by a sum of the breakdown voltages of the second diodes 26 and which is relevant when a positive voltage is applied between the first circuit node 21 and the second circuit node 22, deviates from a desired second breakdown voltage. This is explained with reference to an example in the following.

For explanation purposes it is assumed that it is desired for the protection device 2 to have a first breakdown voltage and a second breakdown voltage that each essentially equal 130V. A protection device 2 of this type can be obtained by implementing the protection device 2 with 22 first diodes 25 each having a breakdown voltage of 6V and 22 second diodes 26 each having a breakdown voltage of 6V, resulting in first and second breakdown voltages of 132V.

Referring to the above, the widths of the third regions 43 may be selected from between 0.1 μm (micrometer) and 1 μm. Forming a first or second diode 25, 26 with a breakdown voltage of 6V, for example, may include forming the respective diode with a width of the third region 43 of about 0.3 μm (300 nanometers (nm)). Typical misalignment errors are in the range of several 10 nm, such as between 30 nm and 80 nm. If, for example, the misalignment error is 60 nm, one of the first and second widths w1, w2 is only 240 nm (300 nm−60 nm), while the other one of the first and second widths w1, w2 is 360 nm (300 nm+60 nm). A width of the third region 43 of a respective diode of only 240 nm results in a breakdown voltage of only about 4.8 V, while a width of the third region 43 of a respective diode of 360 nm results in a breakdown voltage of about 7.2 V. Thus, in this example, the alignment error of 60 nm may have the effect that one of the first and second breakdown voltages is only about 105.6 V (22*4.8 V), while the other one of the first and second breakdown voltages is about 158.4 V (22*7.2 V). This is highly undesirable.

It should be noted that the breakdown voltage of the protection device 2 is not only given by the sum of the breakdown voltages of the diodes that are reverse biased in the respective operating state, which are the first diodes 25 when a positive voltage is applied between the second circuit node 22 and the first circuit node 21, and which are the second diodes 25 when a positive voltage is applied between the first circuit node 21 and the second circuit node 22. Instead, the breakdown voltage of the protection device 2 also includes the sum of forward voltages of those diodes that are forward biased in the respective operating state, which are the second diodes 26 when a positive voltage is applied between the first circuit node 22 and the second circuit node 21, and which are the first diodes 25 when a positive voltage is applied between the first circuit node 21 and the second circuit node 22. The forward voltage of one diode is about 0.7 V, for example, so that in a diode arrangement with 22 first diodes 25 and 22 second diodes 26 the overall forward voltage is 15.4 V (=22*0.7 V). For the ease of explanation, however, the forward voltages have been neglected in the calculation of the breakdown voltages herein above. As the forward voltage is essentially the same in both directions the difference in the breakdown voltages that may occur due to the alignment error is not affected by the forward voltages.

It should be noted that implementing the protection device 2 with equal first and second breakdown voltages is only an example. It is also possible to implement the protection device 2 with different first and second breakdown voltages, for example by implementing the first diodes 25 with a breakdown voltage that is different from the breakdown voltage of the second diodes 26. Furthermore, it is also possible to implement the protection device 2 such that the first diodes do not have the same breakdown voltage and/or the second diodes 26 do not have the same breakdown voltage. In each case, however, it may be desirable to form each of the second implanted regions 46 in the middle between two directly neighboring first implanted regions 45.

Figure 13:
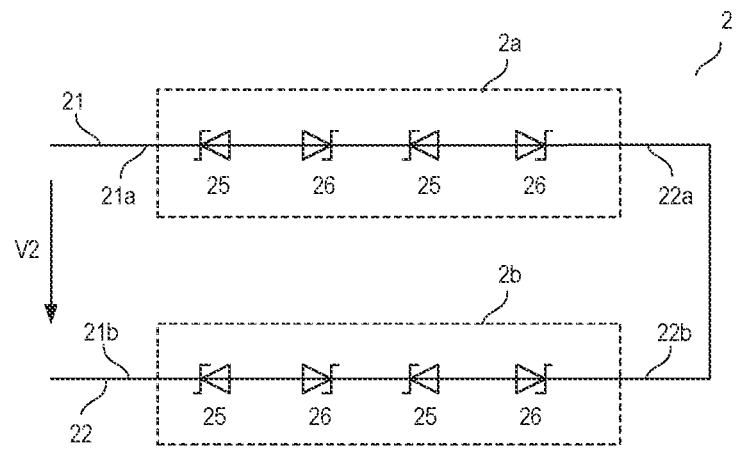
FIG. 13 illustrates an equivalent circuit diagram of a protection device including two diode arrangements according to one example.

FIG. 13 illustrates an equivalent circuit diagram of a protection device 2 in which deviations due to misalignment errors of the first and second breakdown voltages from respective desired first and second breakdown voltages are at least partially compensated. Referring to FIG. 13, the protection device includes a first diode arrangement 2a and a second diode arrangement 2b that each include a first circuit node 21a, 21b and a second circuit node 22a, 22b. Each of the first and second diode arrangements 2a, 2b includes at least one first diode 25 and at least one second diode 26 that are connected in series between the respective first and second circuit nodes 21a, 21b, 22a, 22b. In each of the first and second diode arrangements 2a, 2b, a first diode 25 is a diode in which the cathode faces the respective first circuit node 21a, 21b, and a second diode 26 is a diode in which the cathode faces the respective second circuit node 22a, 22b.

Referring to FIG. 13, the second circuit node 22a of the first diode arrangement 2a is connected to the second circuit node 22b of the second diode arrangement 2b. In this way, in the protection device 2, cathodes of the first diodes 25 in the first diode arrangement 2a and cathodes of the seconds diodes 26 in the second diode arrangement 2b each face the first circuit node 21 of the protection device 2. Equivalently, in the protection device 2, cathodes of the second diodes 26 in the first diode arrangements 2a and cathodes of the first diodes 25 in the second diode arrangement 2b face the second circuit node 22 of the protection device 2.

Connecting the second circuit node 22a of the first diode arrangement 2a to the second circuit node 22b of the second diode arrangement 2b has the effect that the first diodes 25 in the first diode arrangement 2a are connected in series with the second diodes 26 in the second diode arrangement 2b (and in anti-series with the first diodes 25 in the second diode arrangement 2b) and the second diodes 26 in the first diode arrangement 2a are connected in series with the first diodes 25 in the second diode arrangement 2b (and in anti-series with the second diodes 26 in the second diode arrangement 2b). Thus, the first breakdown voltage of the protection device 2 is given by the sum of the breakdown voltages of the first diodes 25 in the first diode arrangement 2a plus the sum of the breakdown voltages of the second diodes 26 in the second diode arrangement 2b. Equivalently, the second breakdown voltage of the protection device 2 is given by the sum of the breakdown voltages of the first diodes 25 in the second diode arrangement 2b plus the sum of the breakdown voltages of the second diodes 26 in the first diode arrangement 2b.

The first and second diodes 25, 26 are formed by the same manufacturing process, so that each of the first and second diodes 25, 26 is affected by the same misalignment error. Referring to the above, a misalignment error may have the effect that breakdown voltages of the first diodes 25 are lower than desired and that breakdown voltages of the second diodes 26 are higher than desired, or that breakdown voltages of the second diodes 26 are lower than desired and that breakdown voltages of the first diodes 25 are higher than desired. As the first breakdown voltage of the protection device 2 is dependent on both breakdown voltages of first diodes 25 in the first diode arrangement 2a and breakdown voltages of seconds diodes 26 in the second diode arrangement 2b deviations of the breakdown voltages of the first and second diodes 25, 26 from a respective desired breakdown voltage are at least partially compensated in view of the desired first breakdown voltage. Equivalently, as the second breakdown voltage of the protection device 2 is dependent on both breakdown voltages of first diodes 25 in the second diode arrangement 2a and breakdown voltages of first diodes 26 in the second diode arrangement 2b deviations of the breakdown voltages of the first and second diodes 25, 26 from a respective desired breakdown voltage are at least partially compensated in view of the desired second breakdown voltage.

The first and second diodes 25, 26 in the first and second diode arrangements 2a, 2b are formed by the same manufacturing process, wherein first, second and third regions of the first and second diodes 25, 26 of the first diode arrangement 2a are formed in a first polysilicon layer, and first, second and third regions of the first and second diodes 25, 26 of the second diode arrangement 2b are formed in a second polysilicon layer separate from the first polysilicon layer. Different examples for implementing a protection device 2 of this type that includes two diode arrangements 2a, 2b are explained in the following. In the following, when a differentiation between the first, second and third region is not required, these regions are briefly referred to as active regions.

Figure 14:
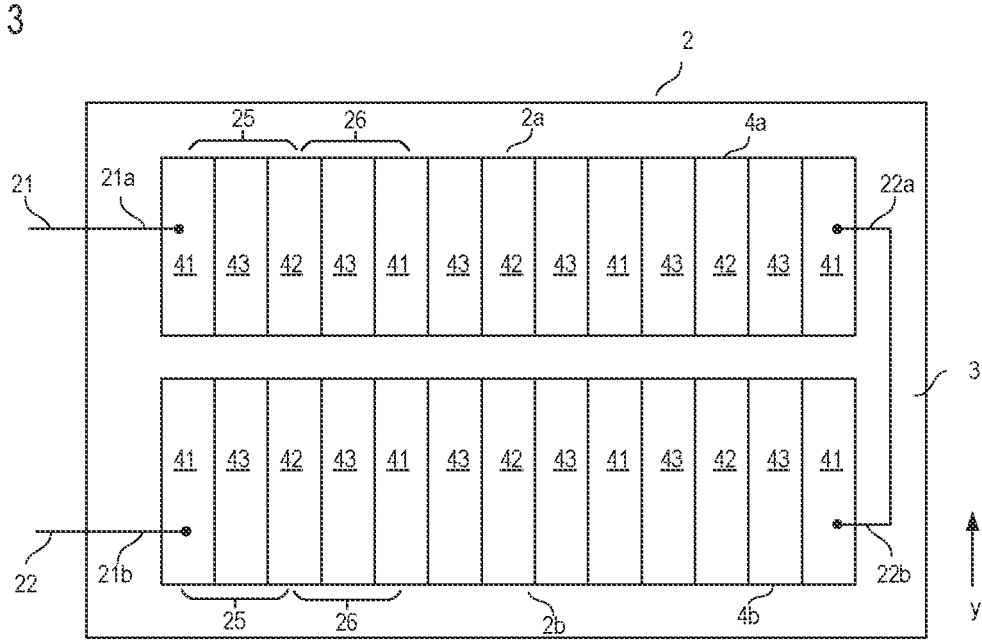

FIG. 14 shows a top view of a protection device 2 according to one example. In this example, the first, second and third regions 41, 42, 43 forming the first and second diodes 25, 26 of the first diode arrangement 2a are formed in a first polysilicon layer 4a and the first, second and third regions 41, 42, 43 forming the first and second diodes 25, 26 of the second diode arrangement 2b are formed in a second polysilicon layer 4b. In this example, the first polysilicon layer 4a is spaced apart from the second polysilicon layer 4b in the second direction y, which is perpendicular to the first direction x.

The active regions 41, 42, 43 in each of the first and second diode arrangements 2a, 2b have been formed by the same manufacturing process. That is, the first regions 41 in each of the first and second diode arrangements 2a, 2b have been formed by forming first implanted regions using the same first implantation mask and a thermal process, and the second regions 42 in each of the first and second diode arrangements 2a, 2b have been formed by forming second implanted regions using the same second implantation mask and a thermal process. One and the same thermal process may be used to form the first regions 41 based on the first implanted regions and the second regions 42 based on the second implanted regions.

According to one example, the first and second polysilicon layers 4a, 4b are formed to be separate layers before performing the first and second implantation processes. According to another example, the first and second polysilicon layers 4a, 4b form a contiguous polysilicon layer throughout the first and second implantation processes and are separated from one another after the implantation processes and before the thermal process, or after the thermal process. Separating the first and second polysilicon layers 4a, 4b may include an etching process that etches away a section of the polysilicon layer between the first and second polysilicon layers 4a, 4b down to the insulation layer 3.

The second circuit nodes 22a, 22b of the first and second diode arrangements 2a, 2b may be connected using any kind of conventional wiring technology. Just for the purpose of illustration, in the example shown in FIG. 14, each of the first and second circuit nodes 22a, 22b is formed by a respective first region 41.

FIG. 15 shows a top view of a protection device 2 according to another example. Like in the example explained with reference to FIG. 14, the first, second and third regions 41, 42, 43 forming the first diode arrangement 2a are formed in a first polysilicon layer 4a and the first, second and third regions 41, 42, 43 forming the second diode arrangement 2b are formed in a second polysilicon layer 4b. In the example illustrated in FIG. 15, however, the second polysilicon layer 4b is spaced apart from the first polysilicon layer 4a in the first direction x.

The active regions 41, 42, 43 in each of the first and second diode arrangements 2a, 2b have been formed by the same manufacturing process. That is, the first regions 41 in each of the first and second diode arrangements 2a, 2b have been formed by forming first implanted regions using the same first implantation mask and a thermal process, and the second regions 42 in each of the first and second diode arrangements 2a, 2b have been formed by forming second implanted regions using the same second implantation mask and a thermal process. One and the same thermal process may be used to form the first regions 41 based on the first implanted regions and the second regions 42 based on the second implanted regions.

According to one example, the first and second polysilicon layers 4a, 4b according to FIG. 15 are formed to be separate layers before performing the first and second implantation processes. According to another example, the first and second polysilicon layers 4a, 4b form a contiguous polysilicon layer throughout the first and second implantation processes and are separated from one another after the implantation processes and before the thermal process, or after the thermal process. Separating the first and second polysilicon layers 4a, 4b may include an etching process that etches away a section of the polysilicon layer between the first and second polysilicon layers 4a, 4b down to the insulation layer 3.

According to one example, separating the first and second polysilicon layers 4a, 4b after performing the first and second implantation processes includes separating a first region 41 or a second region 42 into two sections. The result of this is illustrated in the example shown in FIG. 16. Just for the purpose of illustration, in the example shown in FIG. 16, a first region 41 has been separated into two sections. Separating the first region 41 into two sections may include forming an insulation layer 71 (as illustrated) that extends down to the insulation layer 3 within the first region 41, or may include etching away a section of the first region 41 (not illustrated) down to the insulation layer. After separating the first region 41 into two sections one of these sections forms the second circuit node 22a of the first diode arrangement 2a and the other one of the two sections forms the first circuit node 21b of the second diode arrangement 2b.

According to one example, in each of the first and second diode arrangements 2a, 2b the number of first diodes 25 equals the number of seconds diodes 26, and the number of first and second diodes in the first diode arrangement 2a equals the number of first and second diodes in the second diode arrangement 2b. Furthermore, according to one example, the first and second diodes 25, 26 in each of the first and second diode arrangements 2a, 2b have the same desired breakdown voltage. In this example, there is essentially no deviation of the first and second breakdown voltages of the protection device from desired first and second breakdown voltages.

However, a certain compensation of breakdown voltage variations that may occur due to misalignment errors can be achieved in a protection device of the type illustrated in FIG. 13 even in those cases in which the number of first diodes 25 in the first diode arrangement 2a is different from the number of first diodes 25 in the second diode arrangement 2b and the number of second diodes 26 in the first diode arrangement 2a is different from the number of seconds diodes 26 in the second diode arrangements 2b.

According to one example, the overall number of first diodes 25 in the protection device 2 is selected from between 10 and 50, and the overall number of second diodes 26 in the protection device 2 is selected from between 10 and 50.

It should be noted that the protection device 2 is not restricted to be implemented with two diode arrangements 2a, 2b, as explained with reference to FIGS. 13-16 herein before. Basically, an arbitrary number of diode arrangements each including at least one first diode and at least second diode connected in anti-series and each integrated in a respective polysilicon layer that is separated from the polysilicon layers of the other diode arrangements can be connected in series to form the protection device 2, wherein the diode arrangements are connected in series such that neighboring diode arrangements in the series circuit either have their second circuit nodes connected or have their first circuit nodes connected.

Figure 17:
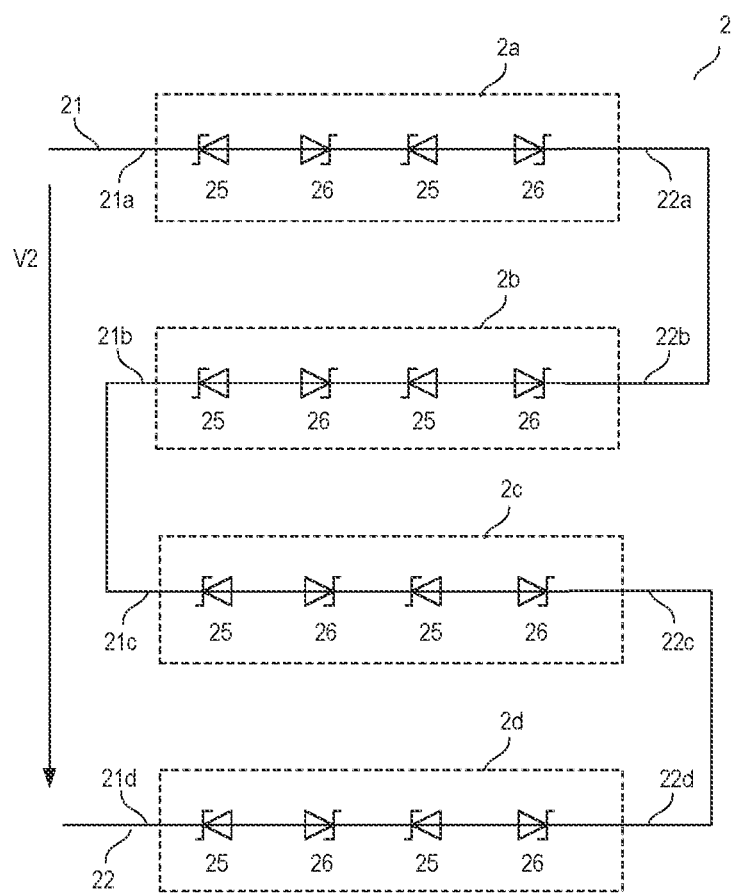
FIG. 17 illustrates an equivalent second diagram of a protection device including several diode arrangements according to another example.

For the purpose of illustration, FIG. 17 illustrates a protection device 2 having four diode arrangements 2a, 2b, 2c, 2d connected in series. In the series circuit including the four diode arrangements 2a, 2b, 2c, 2d, (a) the second circuit node 22a of the first diode arrangement 2a is connected to the second circuit node 22b of the second diode arrangements 2b, (b) the first circuit node 21b of the second diode arrangement 2b is connected to the first circuit node 21c of the third diode arrangement 2c, and (c) the second circuit node 22c of the third diode arrangement 2c is connected to the second circuit node 22d of the fourth diode arrangement 2d. In this arrangement, the first circuit node 22a of the first diode arrangement 2a forms the first circuit node 21 of the protection device 2, and the first circuit node 21d of the fourth diode arrangement 2d forms the second circuit node 22 of the protection device 2.

Each of the diode arrangements 2a-2d illustrated in FIG. 17 can be implemented in accordance with any of the examples illustrated in FIGS. 14-17.

Some of the aspects explained above are summarized in the following by way of numbered examples.

Example A1. A circuit arrangement, including: an electronic circuit integrated in a semiconductor body; an input pin coupled to the electronic circuit; an insulation layer formed on top of the semiconductor body; and a protection device connected to the input pin, wherein the protection device is integrated in a polysilicon layer formed on top of the insulation layer.

Example A2. The circuit arrangement of example A1, wherein the protection device includes: a plurality of first regions of a first doping type and plurality of second regions of a second doping type complementary to the first doping type, wherein the first regions and the second regions are arranged alternatingly in the polysilicon layer.

Example A3. The circuit arrangement of example A2, wherein the protection device further includes: a plurality of third regions, wherein each third region is arranged between a respective one of the first regions and a respective one of the second regions.

Example A4. The circuit arrangement of example A3, wherein each of the first regions is separated from each neighboring second region by a respective one of the third regions.

Example A5. The circuit arrangement of example A3, wherein at least some of the first regions each adjoin a respective one of the second regions to form a respective pn-junction, and wherein at least some of the pn-junctions are bypassed by an electrical connection.

Example A6. The circuit arrangement of any one of examples A3 to A5, wherein each of the third regions is an intrinsic region or a lowly doped region.

Example A7. The circuit arrangement of any one of examples A1 to A7, further including: a plurality of cooling fins formed in a further insulation layer on top of the polysilicon layer, wherein each cooling fin is connected to at least one of the first regions and the second regions.

Example A8. The circuit arrangement of example A7, wherein each cooling fin is connected only to a respective one of the first regions and the second regions.

Example A9. The circuit arrangement of example A7, wherein at least some of the cooling fins are each connected to a respective first region and a second region adjoining the respective first region in order to bypass a pn-junction formed between the respective first region and the adjoining second region.

Example A10. The circuit arrangement of any one of examples A1 to A9, wherein a thickness of the polysilicon layer is between 50 nanometers and 300 nanometers.

Example A11. The circuit arrangement of any one of examples A1 to A10, wherein the plurality of first regions includes between 3 and 30 first regions, and wherein the plurality of second regions includes between 3 and 30 second regions.

Example A12. The circuit arrangement of any one of examples A3 to A11, wherein a width of each of the third regions is between 0.1 micrometers and 1 micrometer.

Example A13. The circuit arrangement of any one of examples A1 to A12, wherein the protection device is connected between the input and a first contact region of the semiconductor body.

Example A14. The circuit arrangement of example A13, wherein the protection device includes a tap connected to a second contact region of the semiconductor body, wherein each of the first contact region and the second contact region has a first doping type, wherein the semiconductor body includes a doped region of a second doping type complementary to the first doping type, wherein the doped region separates the first contact region from the second contact region.

Example A15. The circuit arrangement of any one of examples A1 to A14, wherein the input is a first input, wherein the protection device is a first protection device, and wherein the circuit arrangement further includes at least one further input and at least one further protection device connected to the at least one further input.

Example B1. A method including: forming a first diode arrangement including at least one first diode and at least one second diode connected in anti-series between a first circuit node and a second circuit node of the first diode arrangement; forming a second diode arrangement including at least one first diode and at least one second diode connected in anti-series between a first circuit node and a second circuit node of the second diode arrangement; and connecting the second circuit node of the first diode arrangement and the second circuit node of the second diode arrangement, wherein forming the first diode arrangement includes implanting first type dopant atoms into a first polysilicon layer in a first implantation process using a first implantation mask to form first implanted regions, and implanting second type dopant atoms into the first polysilicon layer in a second implantation process and using a second implantation mask to form at least one second implanted region, wherein the first implanted regions and the at least one second region are arranged alternatingly in a first direction and are separated from one another by third regions of the first polysilicon layer, wherein forming the second diode arrangement includes implanting first type dopant atoms into a second polysilicon layer different from the first polysilicon layer in the first implantation process using the first implantation mask to form first implanted regions, and implanting second type dopant atoms into the second polysilicon layer in the second implantation process and using the second implantation mask to form at least one second implanted region, wherein the first implanted regions and the at least one second region are arranged alternatingly in the first direction and are separated by third regions of the second polysilicon layer, and wherein in each of the first and second diode arrangements, the respective second circuit node is spaced apart from the respective first circuit node in the first direction.

Example B2. The method of example B1, wherein the second polysilicon layer is spaced apart from the first polysilicon layer in the first direction.

Example B3. The method of example B1, wherein the second polysilicon layer is spaced apart from the first polysilicon layer in a second direction perpendicular to the first direction.

Example B4. The method of any one of examples B1 to B3, wherein the first and second polysilicon layers are separate layers before the first and second implantation processes.

Example B5. The method of any one of examples B1 to B3, wherein the first and second polysilicon layers form a contiguous polysilicon layer before the first and second implantation processes, and wherein the first and second polysilicon layers are separated from one another after the first and second implantation processes.

Example B6. The method of any one of the preceding examples, wherein in each of the first and second diode arrangements the first and second implanted regions are formed such that a width of the third regions in the first direction is between 0.1 micrometers and 1 micrometer.

Example B7. The method of any one of the preceding examples, wherein in each of the first and second diode arrangements the first implanted regions are formed to be equally spaced, and wherein a distance between two directly neighboring first implanted regions is essentially the same in each of the first and second diode arrangements.

Example B8. The method of any one of the preceding examples, wherein the first diode arrangement and the second diode arrangement include the same number of first diodes, wherein the first diode arrangement and the second diode arrangement include the same number of second diodes, and wherein the number of first diodes equals the number of second diodes in each of the first and second diode arrangement.

Example B9. The method of any one of the preceding examples, wherein the method further includes a thermal process to form first doped regions based on the first implanted regions and second doped regions based on the second implanted regions.

Example B10. A protection device including: a first diode arrangement and a second diode arrangement each including at least one first diode and at least one second diode connected in anti-series between a respective first circuit node and a respective second circuit node, wherein second circuit node of the first diode arrangement is connected to the second circuit node of the second diode arrangement, wherein each of the first and second diodes in the first and second diode arrangements includes a first doped region and second doped region that are separated by a third region, wherein the first and second diodes of the first diode arrangement are integrated in a first polysilicon layer and the first and second diodes of the second diode arrangement are integrated in a second polysilicon layer, wherein, in the at least one first diode in each of the first and second diode arrangements, the second doped region is spaced apart from the first doped region in a first direction, and wherein in each of the first and second diode arrangements the respective second circuit node is spaced apart from the respective first circuit node in the first direction.

Example B11. The protection device example B10, wherein the second polysilicon layer is spaced apart from the first polysilicon layer in the first direction.

Example B12. The protection device of example B11, wherein the second polysilicon layer is spaced apart from the first polysilicon layer in a direction perpendicular to the first direction.

Example B13. The protection device according to example B11 or B12, wherein the number of first diodes equals the number of second diodes in each of the first and second diode arrangements, and wherein the first and second diode arrangements have the same number of first diodes.

Example B14. The protection device of any one of examples B10 to B13, wherein the overall number of first diodes in the protection device is between 10 and 50, and wherein the overall number of second diodes in the protection device is between 10 and 50.

What is claimed is:

1. A method, comprising:
    forming a first diode arrangement including at least one first diode and at least one second diode connected in anti-series between a first circuit node and a second circuit node of the first diode arrangement;
    forming a second diode arrangement including at least one first diode and at least one second diode connected in anti-series between a first circuit node and a second circuit node of the second diode arrangement; and
    connecting the second circuit node of the first diode arrangement and the second circuit node of the second diode arrangement,
    wherein forming the first diode arrangement comprises implanting first type dopant atoms into a first polysilicon layer in a first implantation process using a first implantation mask to form first implanted regions, and implanting second type dopant atoms into the first polysilicon layer in a second implantation process and using a second implantation mask to form at least one second implanted region, wherein the first implanted regions and the at least one second implanted region are arranged alternatingly in a first direction and are separated from one another by third regions of the first polysilicon layer,
    wherein forming the second diode arrangement comprises implanting first type dopant atoms into a second polysilicon layer in the first implantation process using the first implantation mask to form first implanted regions, and implanting second type dopant atoms into the second polysilicon layer in the second implantation process and using the second implantation mask to form at least one second implanted region, wherein the first implanted regions and the at least one second implanted region are arranged alternatingly in the first direction and are separated by third regions of the second polysilicon layer, and
    wherein in each of the first and second diode arrangements, the respective second circuit node is spaced apart from the respective first circuit node in the first direction,
    wherein in a plan-view of the first and second diode arrangements, the first polysilicon layer and the second polysilicon layer are each enclosed regions that are spaced apart from one another.

2. The method of claim 1, wherein the second polysilicon layer is spaced apart from the first polysilicon layer in the first direction.

3. The method of claim 1, wherein the second polysilicon layer is spaced apart from the first polysilicon layer in a second direction perpendicular to the first direction.

4. The method of claim 1, wherein the first and second polysilicon layers are separate layers before the first and second implantation processes.

5. The method of claim 1, wherein the first and second polysilicon layers form a contiguous polysilicon layer before the first and second implantation processes, and wherein the first and second polysilicon layers are separated from one another after the first and second implantation processes.

6. The method of claim 1, wherein in each of the first and second diode arrangements, the first and second implanted regions are formed such that a width of the third regions in the first direction is between 0.1 micrometers and 1 micrometer.

7. The method of claim 1, wherein in each of the first and second diode arrangements, the first implanted regions are formed to be equally spaced, and wherein a distance between two directly neighboring first implanted regions is essentially the same in each of the first and second diode arrangements.

8. The method of claim 1, wherein the first diode arrangement and the second diode arrangement include the same number of first diodes, wherein the first diode arrangement and the second diode arrangement include the same number of second diodes, and wherein the number of first diodes equals the number of second diodes in each of the first and second diode arrangements.

9. The method of claim 1, further comprising a thermal process to form first doped regions based on the first implanted regions and second doped regions based on the second implanted regions.

* * * * *